United States Patent
Fujimoto et al.

(10) Patent No.: US 12,040,845 B2
(45) Date of Patent: Jul. 16, 2024

(54) RADIO WAVE ENVIRONMENT MEASUREMENT DEVICE

(71) Applicant: Panasonic Corporation, Osaka (JP)

(72) Inventors: Keisuke Fujimoto, Osaka (JP); Takuya Asada, Osaka (JP); Toshiyuki Maeda, Hyogo (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 432 days.

(21) Appl. No.: 17/483,843

(22) Filed: Sep. 24, 2021

(65) Prior Publication Data

US 2022/0029715 A1  Jan. 27, 2022

Related U.S. Application Data

(63) Continuation of application No. PCT/JP2020/006134, filed on Feb. 17, 2020.

(30) Foreign Application Priority Data

Mar. 28, 2019  (JP) .................................. 2019-064444

(51) Int. Cl.
*H04B 17/309* (2015.01)
*B64C 27/08* (2023.01)
*B64C 39/02* (2023.01)
*G01R 29/08* (2006.01)

(52) U.S. Cl.
CPC ........... *H04B 17/309* (2015.01); *B64C 27/08* (2013.01); *B64C 39/02* (2013.01); *G01R 29/08* (2013.01)

(58) Field of Classification Search
CPC ........... B64C 1/36; B64C 27/08; B64C 39/02; B64U 10/14; B64U 2101/00; B64U 2201/104; B64U 50/19; B64U 60/50; G01R 29/08; G01R 29/0871; G01R 29/10; H04B 17/309

See application file for complete search history.

(56) References Cited

U.S. PATENT DOCUMENTS

2018/0351631 A1* 12/2018 Hamabe ............. G01R 29/0892
2019/0115974 A1*  4/2019 Frolov ................... H01Q 1/125

FOREIGN PATENT DOCUMENTS

| JP | 2018-096928 A | 6/2018 |
| JP | 2018-136237 A | 8/2018 |
| JP | 2018-155710 A | 10/2018 |
| WO | 2017/134715 A1 | 8/2017 |

OTHER PUBLICATIONS

International Search Report issued in corresponding International Patent Application No. PCT/JP2020/006134, dated May 21, 2020, with English translation.

* cited by examiner

*Primary Examiner* — Nguyen T Vo

(74) *Attorney, Agent, or Firm* — Rimon P.C.

(57) ABSTRACT

A radio wave environment measurement device includes: a multi-copter type unmanned flight vehicle configured to move in midair; a polyhedron attached to an airframe of the multi-copter type unmanned flight vehicle, the polyhedron having a plurality of surfaces; and an antenna provided on each of the plurality of surfaces of the polyhedron.

8 Claims, 15 Drawing Sheets

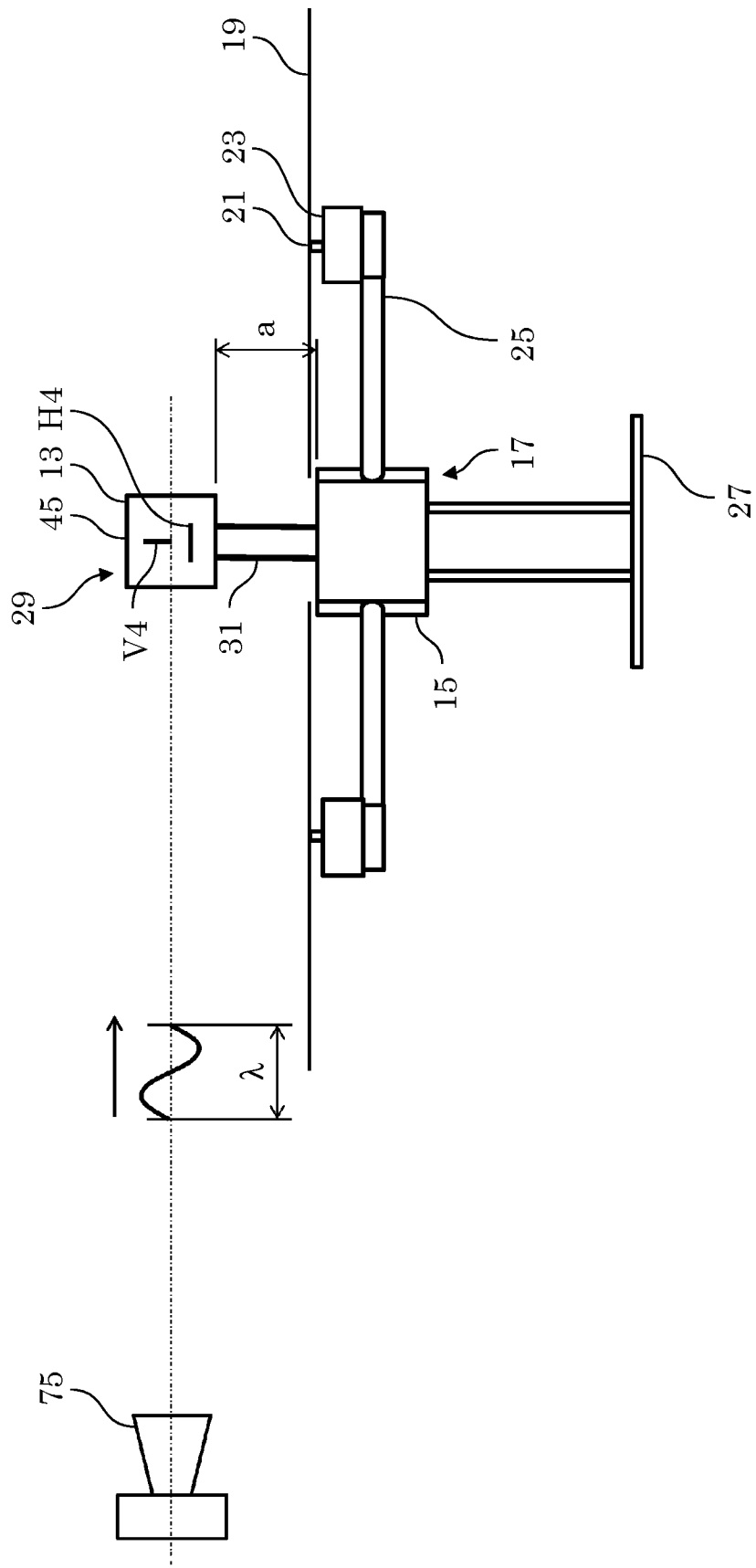

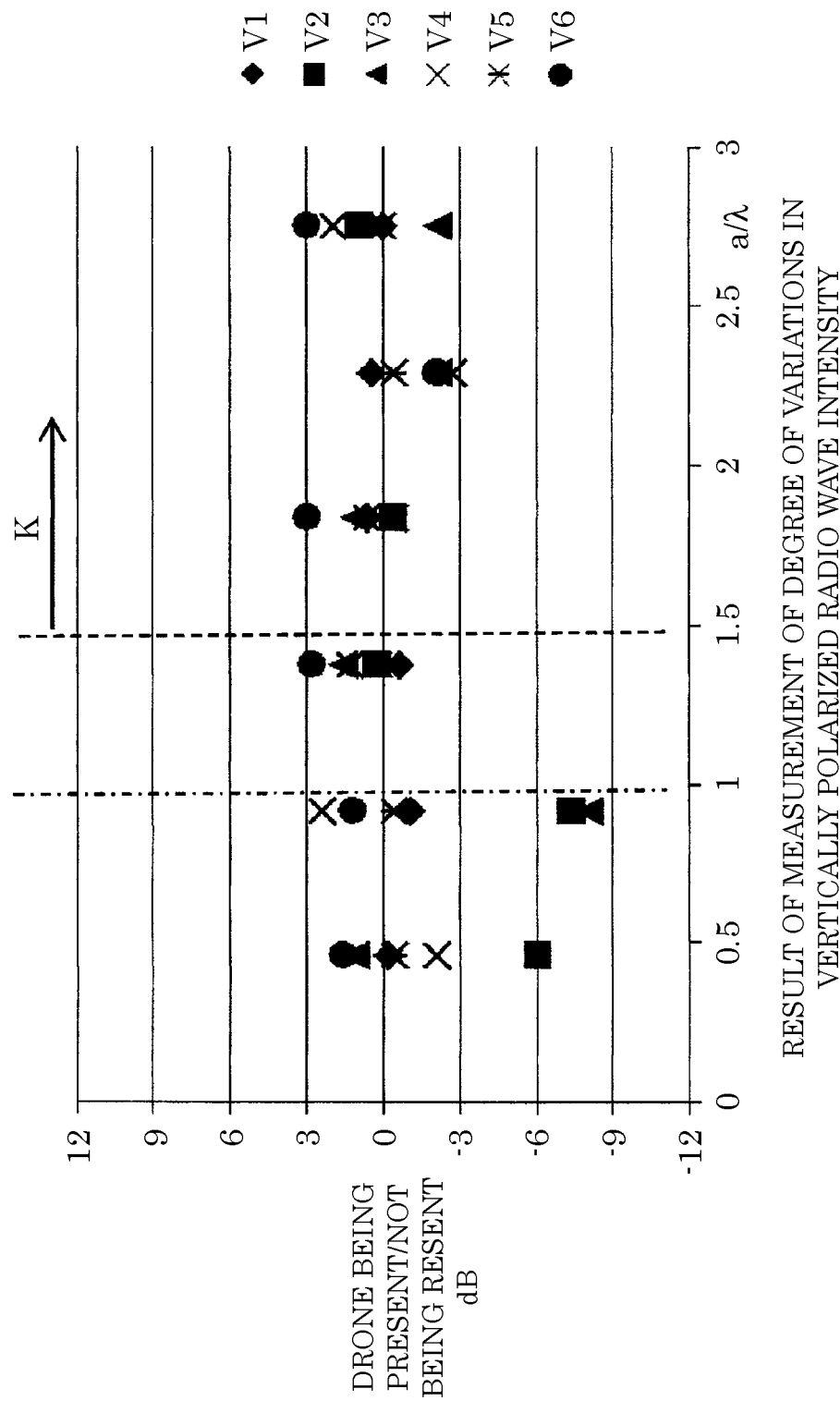

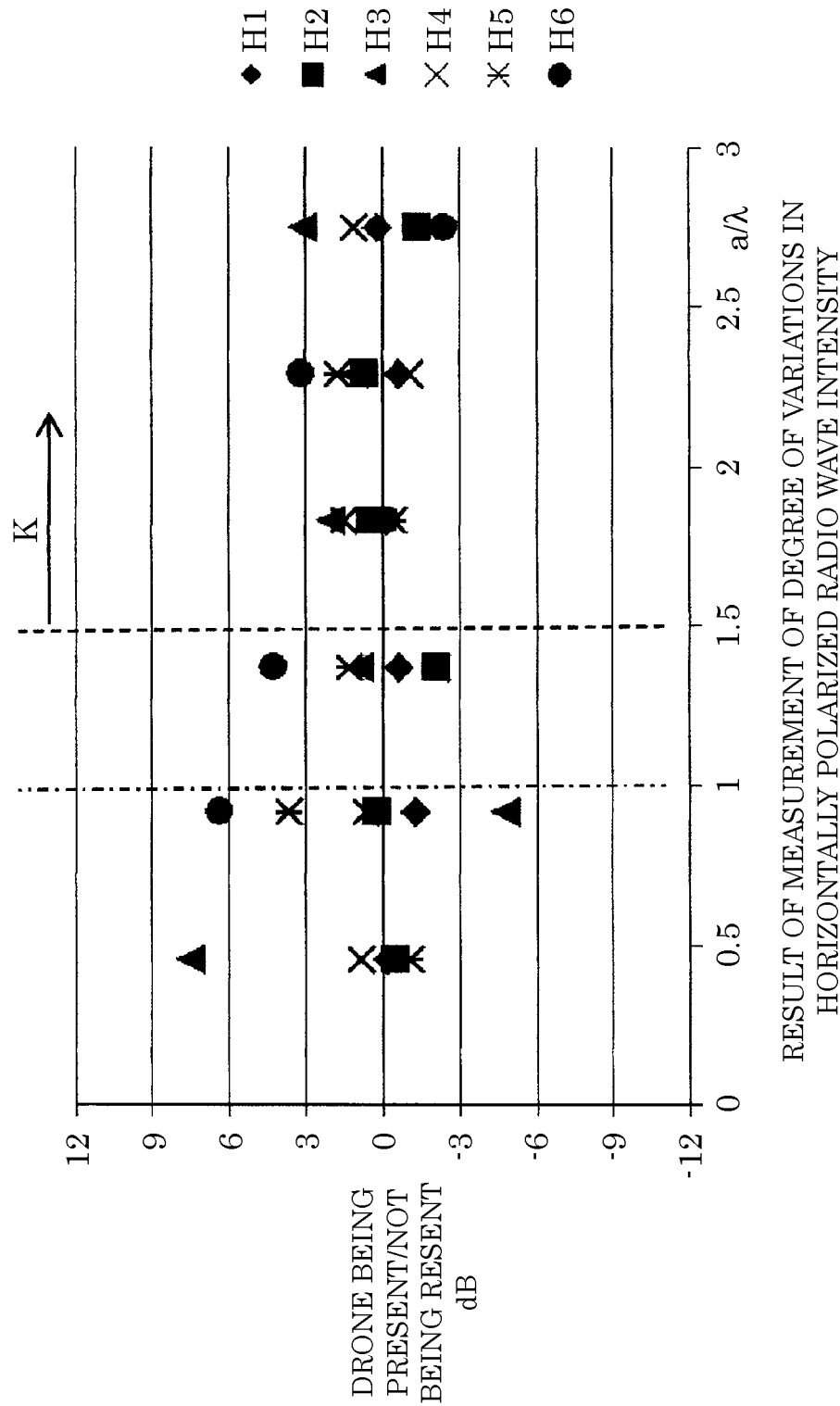

RADIO WAVE ENVIRONMENT MEASUREMENT DEVICE

CROSS-REFERENCE OF RELATED APPLICATIONS

This application is a U.S. Continuation of International Patent Application No. PCT/JP2020/006134, filed on Feb. 17, 2020, which in turn claims the benefit of Japanese Application No. 2019-064444, filed on Mar. 28, 2019, the entire disclosures of which Applications are incorporated by reference herein.

BACKGROUND

1. Technical Field

The present disclosure relates to a radio wave environment measurement device.

2. Description of the Related Art

Patent Literature (PTL) 1 discloses a radiant power measurement system including a base station, a drone, and a drone control device. The drone includes a reception antenna that receives a radio wave coming from the base station, and a power measurement unit that measures power of the received radio wave. The drone control device includes a location/orientation controller that moves the drone to a given location separated away from the base station by a given distance and that rotates the drone such that the incoming direction of the radio wave corresponds to the direction of the reception antenna.

PTL 1 is Unexamined Japanese Patent Publication No. 2018-96928.

SUMMARY

The present disclosure has been made in view of the above-described conventional situation, and an object of the present disclosure is to provide a radio wave environment measurement device that improves the efficiency of radio wave measurement using a multi-copter type unmanned flight vehicle.

The present disclosure provides a radio wave environment measurement device including: a multi-copter type unmanned flight vehicle configured to move in midair; a polyhedron attached to an airframe of the multi-copter type unmanned flight vehicle, the polyhedron having a plurality of surfaces; and an antenna provided on each of the plurality of surfaces of the polyhedron.

According to the present disclosure, the efficiency of radio wave measurement using a multi-copter type unmanned flight vehicle can be improved.

BRIEF DESCRIPTION OF DRAWINGS

FIG. 17 is a schematic explanatory diagram of a measurement method carried out by using the radio wave environment measurement device according to the first exemplary embodiment.

FIG. 18 is an explanatory diagram showing a degree of variations in a vertically polarized radio wave intensity actually measured by the method of FIG. 17.

FIG. 19 is an explanatory diagram showing a degree of variations in a horizontally polarized radio wave intensity actually measured by the method of FIG. 17.

DETAILED DESCRIPTION (Circumstances that have LED to the Present Disclosure)

In a radiant power measurement system disclosed in Patent Literature 1, antennas have directivity. To search for a direction in which sensitivity is the maximum, a drone needs to be rotated such that the incoming direction of a radio wave corresponds to the direction of a reception antenna. This raises a possibility that a time for measuring the incoming direction of the radio wave increases by a time spent in an operation of rotating the drone.

In the following first exemplary embodiment, an example of a radio wave environment measurement device that improves the efficiency of radio wave measurement using a multi-copter type unmanned flight vehicle will be described.

Hereinafter, exemplary embodiments that specifically disclose configurations and operations of a radio wave environment measurement device according to the present disclosure will be described in detail with proper reference to the drawings. It should be noted that an excessively detailed description may be omitted. For example, detailed description of matters already well-known and overlapping description of substantially the same configuration may be omitted.

This is to avoid making the following description unnecessarily redundant and to facilitate understanding of those who are skilled in the art. The accompanying drawings and the following description are provided to allow those who are skilled in the art to sufficiently understand the present disclosure, and are not intended to limit the subject matter described in the claims.

(Configuration of Radio Wave Environment Measurement Device)

Figure 1:
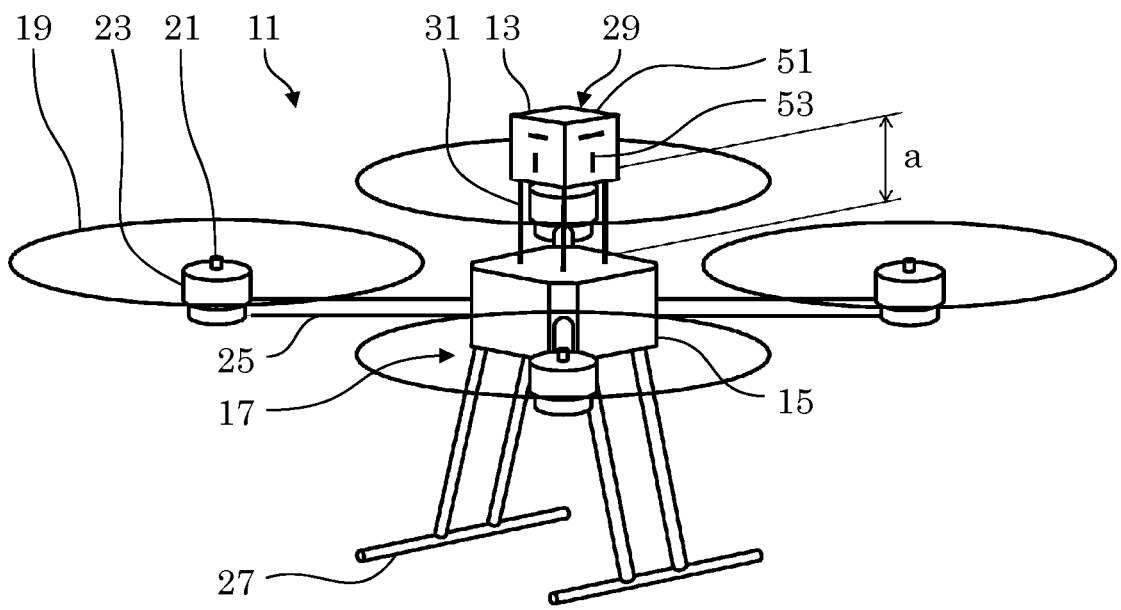
FIG. 1 is a perspective view of a radio wave environment measurement device according to a first exemplary embodiment, the radio wave environment measurement device having a polyhedron attached above an airframe.
Figure 2:
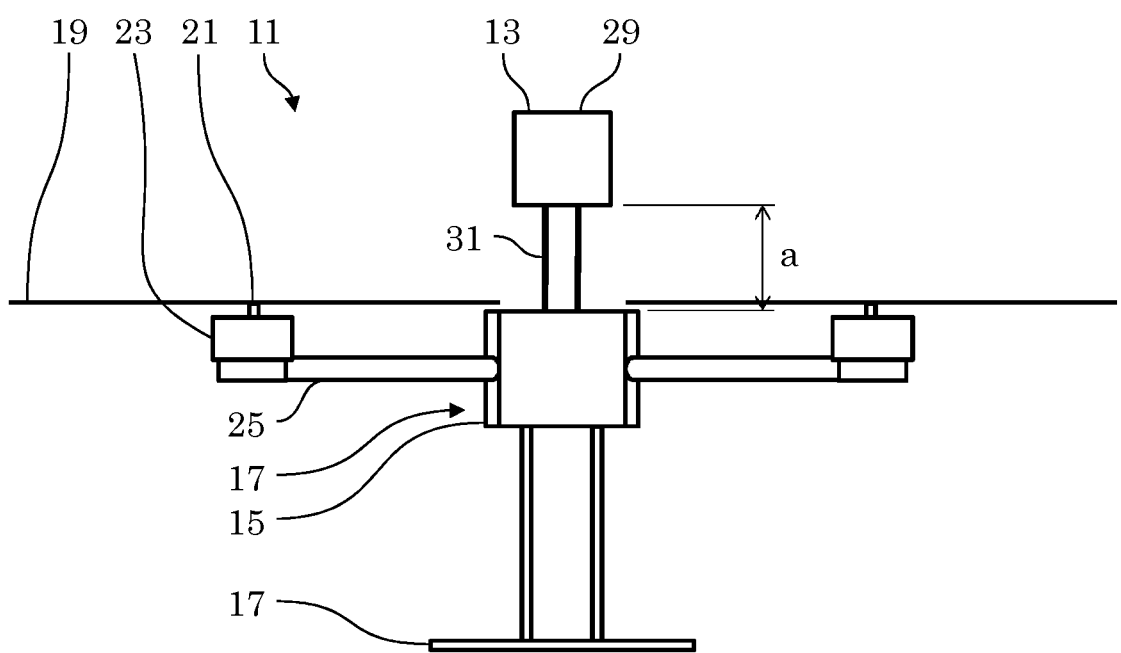
FIG. 2 is a side view of the radio wave environment measurement device shown in FIG. 1.

FIG. 1 is a perspective view of radio wave environment measurement device 11 according to a first exemplary embodiment, the radio wave environment measurement device 11 having polyhedron 13 attached above airframe 15. FIG. 2 is a side view of radio wave environment measurement device 11 shown in FIG. 1. Radio wave environment measurement device 11 mainly includes a multi-copter type unmanned flight vehicle (drone 17) having airframe 15 and capable of moving in midair (that is, in a state of hovering in midair), polyhedron 13, and antennas (horizontal polarization antenna 51 and vertical polarization antenna 53), as main constituent elements.

In the following description, the multi-copter type unmanned flight vehicle is exemplified by drone 17 as an unmanned aerial vehicle (UAV) capable of unmanned flight. Drone 17 flies by performing autonomous control based on a received control signal that is wirelessly transmitted according to an operation on an operation terminal (not illustrated) carried by an operator present at a location distant from drone 17. Drone 17 is illustrated as, for example, a quadcopter having four rotor blades (i.e., rotors 19), but the number of the rotor blades is not limited to four.

Drone 17 has airframe 15. Airframe 15 is covered with a light outer shell made of a synthetic resin. Airframe 15 is formed as, for example, a flat hexahedron. It should be noted that the shape of airframe 15 is not limited to a hexahedron and may be other polyhedrons or streamlined shape (e.g., a teardrop shape, a spheroidal shape, or the like).

To airframe 15, four rotary drivers 23, each of which has the rotor blade (rotor 19) fixed to drive shaft 21 of a motor, are fixed in radial directions, with arm members 25 interposed respectively between airframe 15 and rotary drivers 23. In addition, airframe 15 is provided with a pair of landing skids 27 extending downward in an open-leg-like form.

Airframe 15 houses electrical equipment, such as a receiver, a transmitter, a PC, a flight controller, a gyro sensor, an acceleration sensor, a satellite positioning system, a storage device, a micro processing unit (MPU) section, and a battery.

Polyhedron 13 is attached to airframe 15.

An antenna may be uniformly provided on each of a plurality of surfaces of polyhedron 13. A surface provided with the antenna serves as a planar antenna. With its plurality of surfaces serving respectively as planar antennas, polyhedron 13 makes up polyhedral antenna 29.

Polyhedron 13 is attached to airframe 15 across gap a formed therebetween, gap a being equivalent to one or more wavelengths in a working frequency (center frequency) band the antenna corresponds. It can be said, more specifically, that gap a is a smallest distance between the electrical equipment (metal members) housed in airframe 15 and a shield layer of polyhedral antenna 29.

In radio wave environment measurement device 11, polyhedron 13 is attached to airframe 15 with supports 31 interposed therebetween, supports 31 at least having their surfaces covered with a resin material. For example, one support 31 extends from each of the corners of a bottom surface of polyhedron 13, which means that in total, four supports 31 are fixed to airframe 15. The number of supports 31 is not limited to four, and may be one or two or more. It is preferable that support 31 be of a round bar shape (with a circular cross section).

In radio wave environment measurement device 11, polyhedron 13 may be attached above airframe 15 in the vertical direction.

In radio wave environment measurement device 11, it is preferable that polyhedron 13 have a regular polyhedron shape and be attached to airframe 15 such that the center of the regular polyhedron is put on a vertical line passing through the center of the airframe. It should be noted that "center" refers to a geometric center (in a case of a figure point-symmetric with respect to a given point, the given point is defined as its geometric center). However, when the position of this geometric center is widely different from the position of the center of gravity (center of mass), "center" is read as "center of gravity".

In radio wave environment measurement device 11, polyhedron 13 may be a hexahedron. Polyhedron 13, however, is not limited to a hexahedron. For example, polyhedron 13 formed as a hexahedron is attached to airframe 15 in a direction in which, for example, a pair of parallel surfaces are parallel with an upper surface of airframe 15 and another pair of parallel surfaces are perpendicular to the direction of airframe 15 moving forward and backward.

Figure 3:
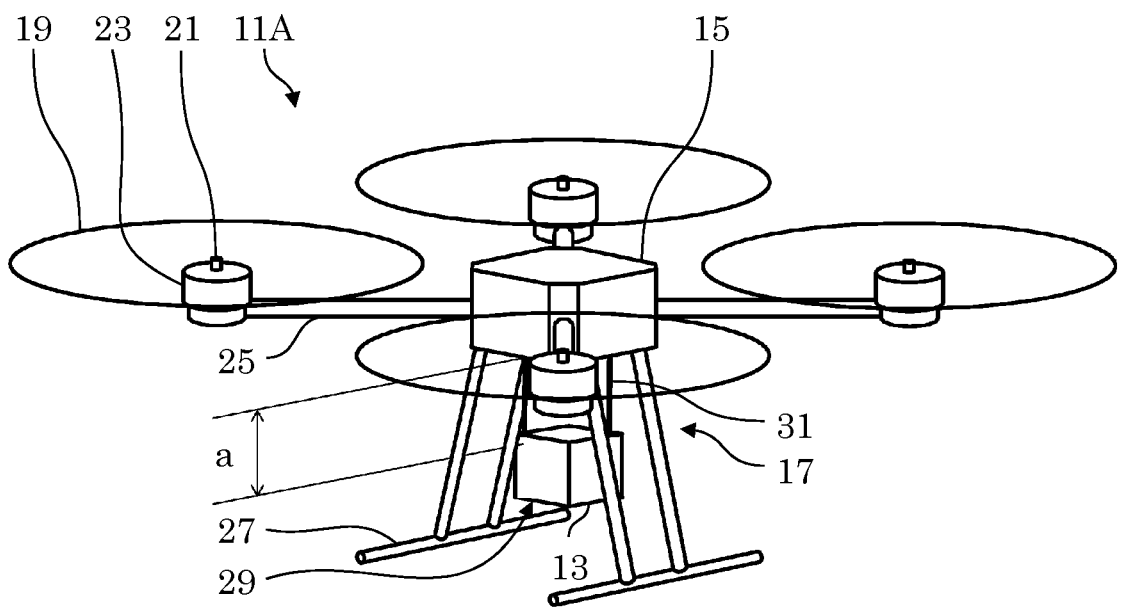
FIG. 3 is a perspective view of a radio wave environment measurement device having the polyhedron attached below the airframe.
Figure 4:
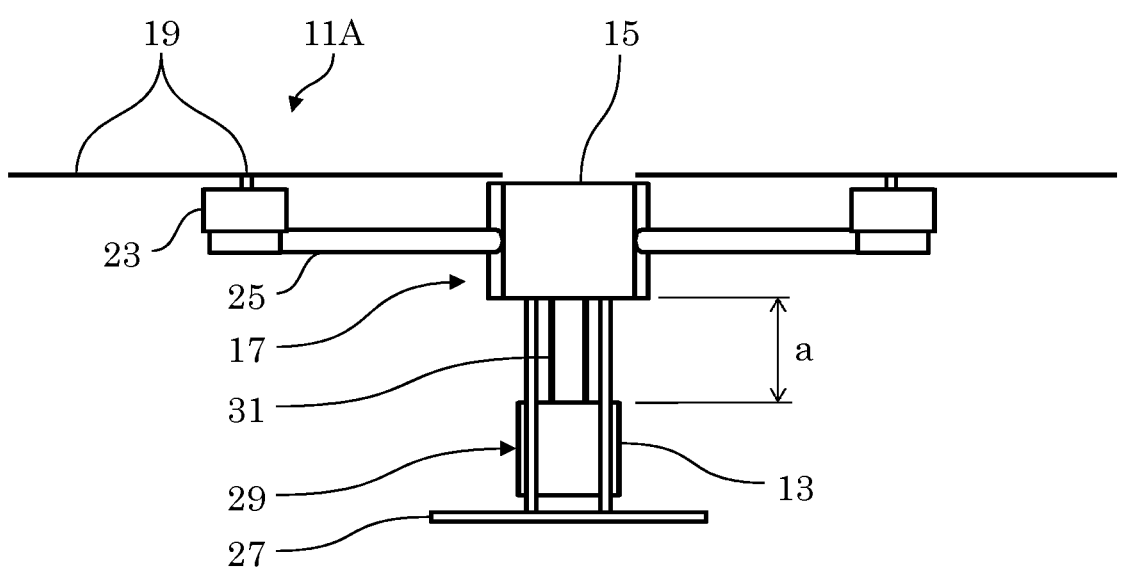
FIG. 4 is a side view of the radio wave environment measurement device shown in FIG. 3.

FIG. 3 is a perspective view of radio wave environment measurement device 11A having polyhedron 13 attached below airframe 15. FIG. 4 is a side view of radio wave environment measurement device 11A shown in FIG. 3. In radio wave environment measurement device 11A, polyhedron 13 may be attached below airframe 15 in the vertical direction. For example, polyhedron 13 formed as a hexahedron is attached to airframe 15 in a direction in which, for example, a pair of parallel surfaces are parallel with a lower surface of airframe 15 and another pair of parallel surfaces are perpendicular to the direction of airframe 15 moving forward and backward. In this case, polyhedron 13 is disposed above lower ends of the pair of landing skids 27 in a space between landing skids 27 so as to allow airframe 15 to avoid coming in contact with the ground upon landing.

Figure 5:
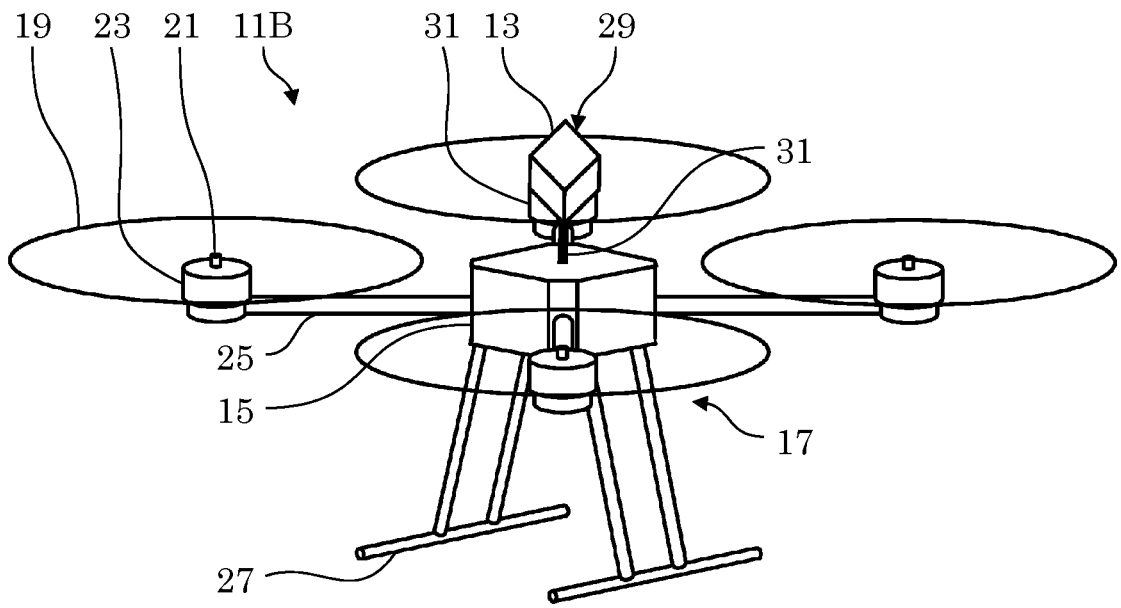
FIG. 5 is a perspective view of a radio wave environment measurement device having the polyhedron attached above the airframe, with an apex of the polyhedron set counter to the airframe.
Figure 6:
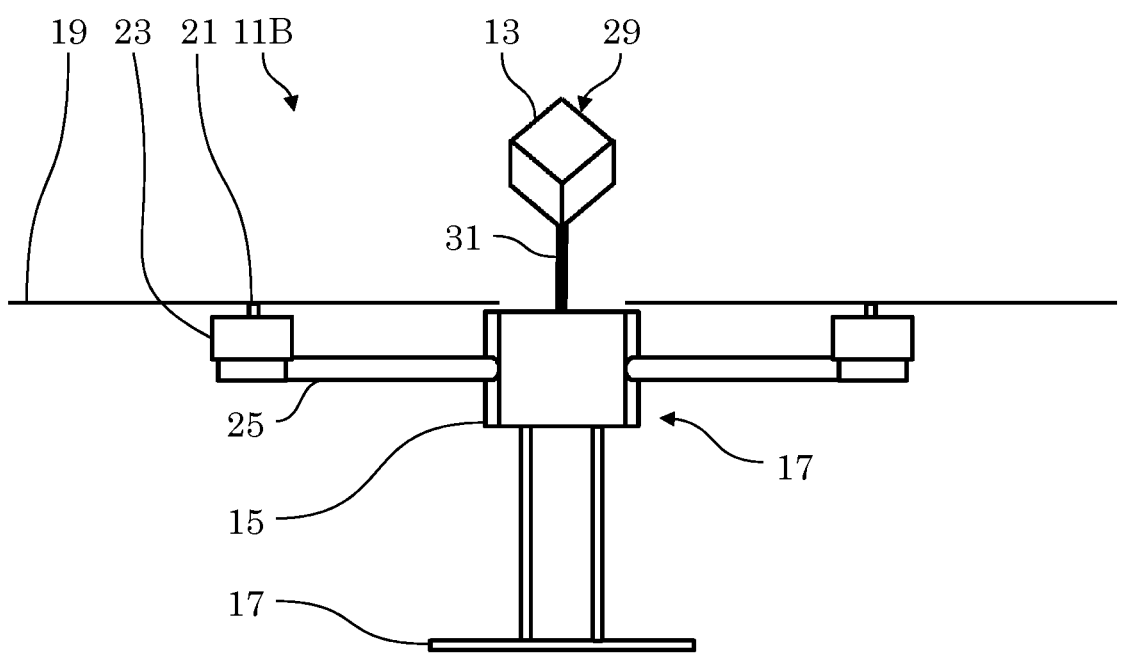
FIG. 6 is a side view of the radio wave environment measurement device shown in FIG. 5.

FIG. 5 is a perspective view of radio wave environment measurement device 11B having polyhedron 13 attached above airframe 15, with an apex of polyhedron 13 set counter to airframe 15. FIG. 6 is a side view of the radio wave environment measurement device 11B shown in FIG. 5. In radio wave environment measurement device 11B, polyhedron 13 may have an apex and be attached to airframe 15, with the apex set counter thereto. Polyhedron 13 can be attached above airframe 15 in the vertical direction, with the apex set counter to airframe 15. In this case, polyhedron 13 formed as a hexahedron is attached to airframe 15 in a direction in which one diagonal line is perpendicular to the upper surface of airframe 15 and another diagonal line is along the direction of airframe 15 moving forward and backward.

Figure 7:
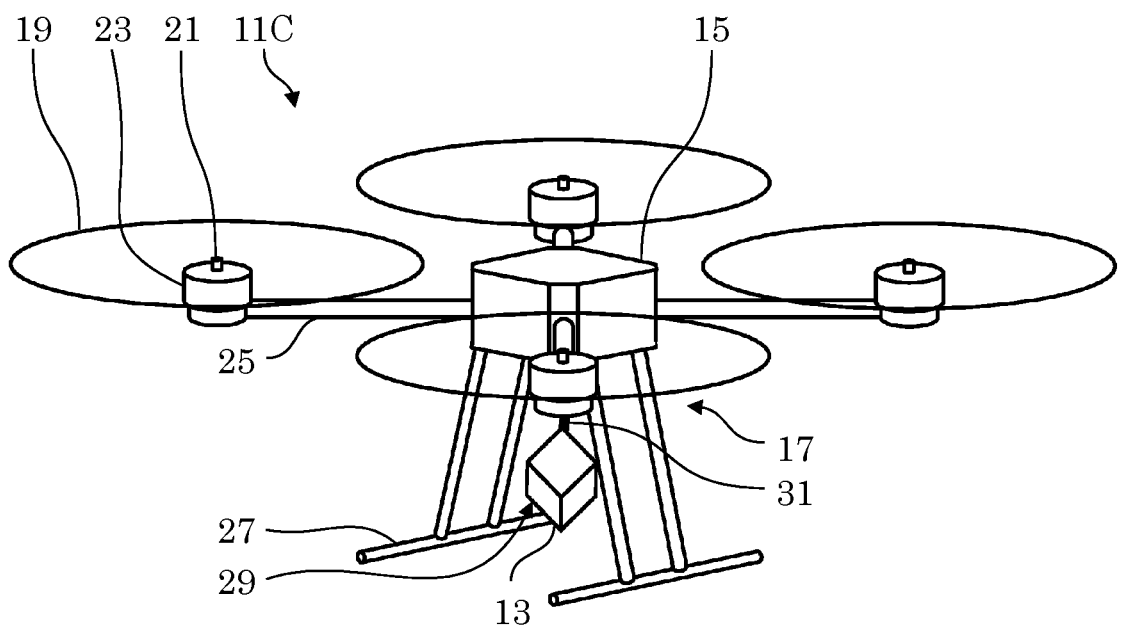
FIG. 7 is a perspective view of a radio wave environment measurement device having the polyhedron attached below the airframe, with an apex of the polyhedron set counter to the airframe.
Figure 8:
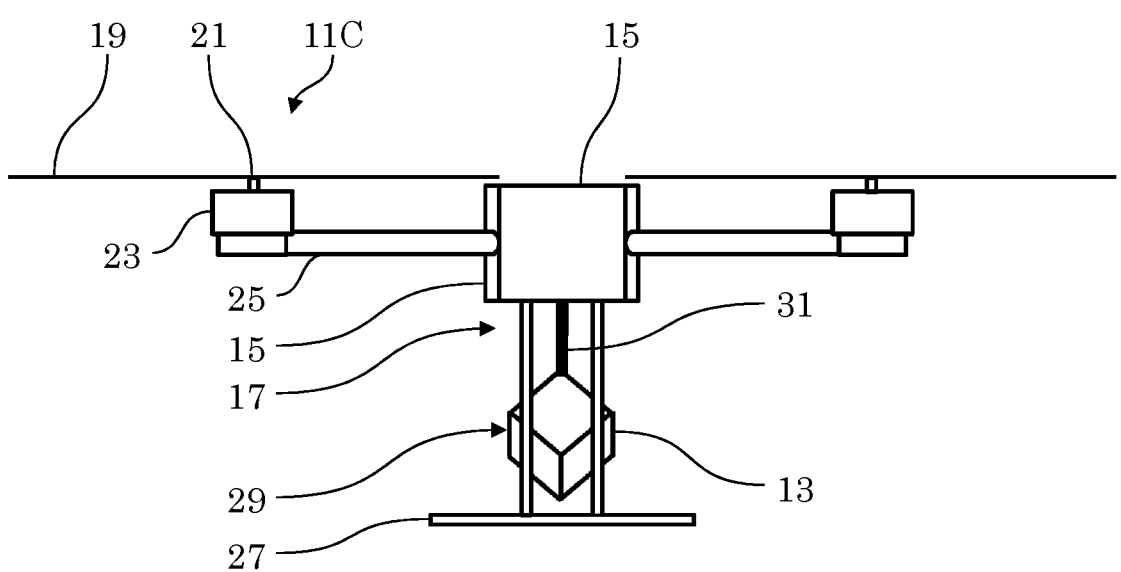
FIG. 8 is a side view of the radio wave environment measurement device shown in FIG. 7.

FIG. 7 is a perspective view of radio wave environment measurement device 11C having polyhedron 13 attached below airframe 15, with an apex of polyhedron 13 set counter to airframe 15. FIG. 8 is a side view of radio wave environment measurement device 11C shown in FIG. 7. Polyhedron 13 may be attached below airframe 15 in the vertical direction, with the apex set counter to airframe 15. In this case, polyhedron 13 formed as a hexahedron is attached to airframe 15 in a direction in which one diagonal line is perpendicular to the lower surface of airframe 15 and another diagonal line is along the direction of airframe 15 moving forward and backward.

Figure 9:
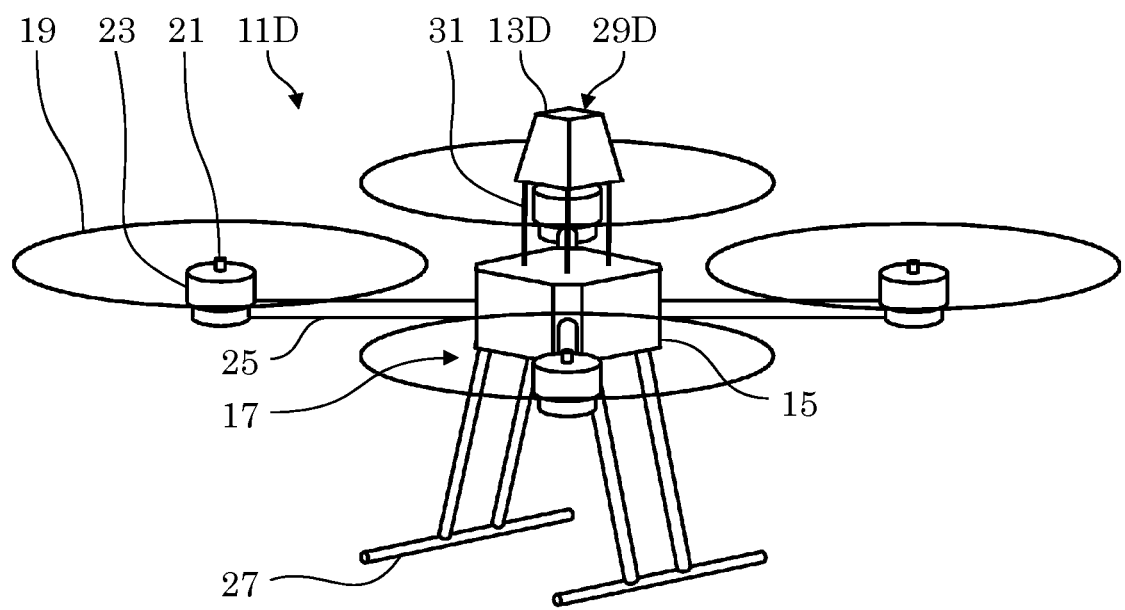
FIG. 9 is a perspective view of a radio wave environment measurement device having a polyhedron of a truncated pyramid attached above the airframe.

FIG. 9 is a perspective view of radio wave environment measurement device 11D having polyhedron 13D of a truncated pyramid attached above airframe 15. In radio wave environment measurement device 11D, polyhedron 13D may be a truncated pyramid. In FIG. 9, polyhedron 13D is shown as a truncated square-based pyramid. Polyhedral antenna 29D of a truncated pyramidal is attached to airframe 15 in a direction in which a bottom area is larger than an upper area. In this case, polyhedron 13D may have a configuration in which no antenna is provided on its bottom surface.

This polyhedron may be a polyhedron different from the above-mentioned hexahedron and truncated pyramid. Specifically, the polyhedron may be a tetrahedron, an octahedron, a dodecahedron, or the like. The polyhedron may also be a truncated triangular pyramid.

Figure 10:
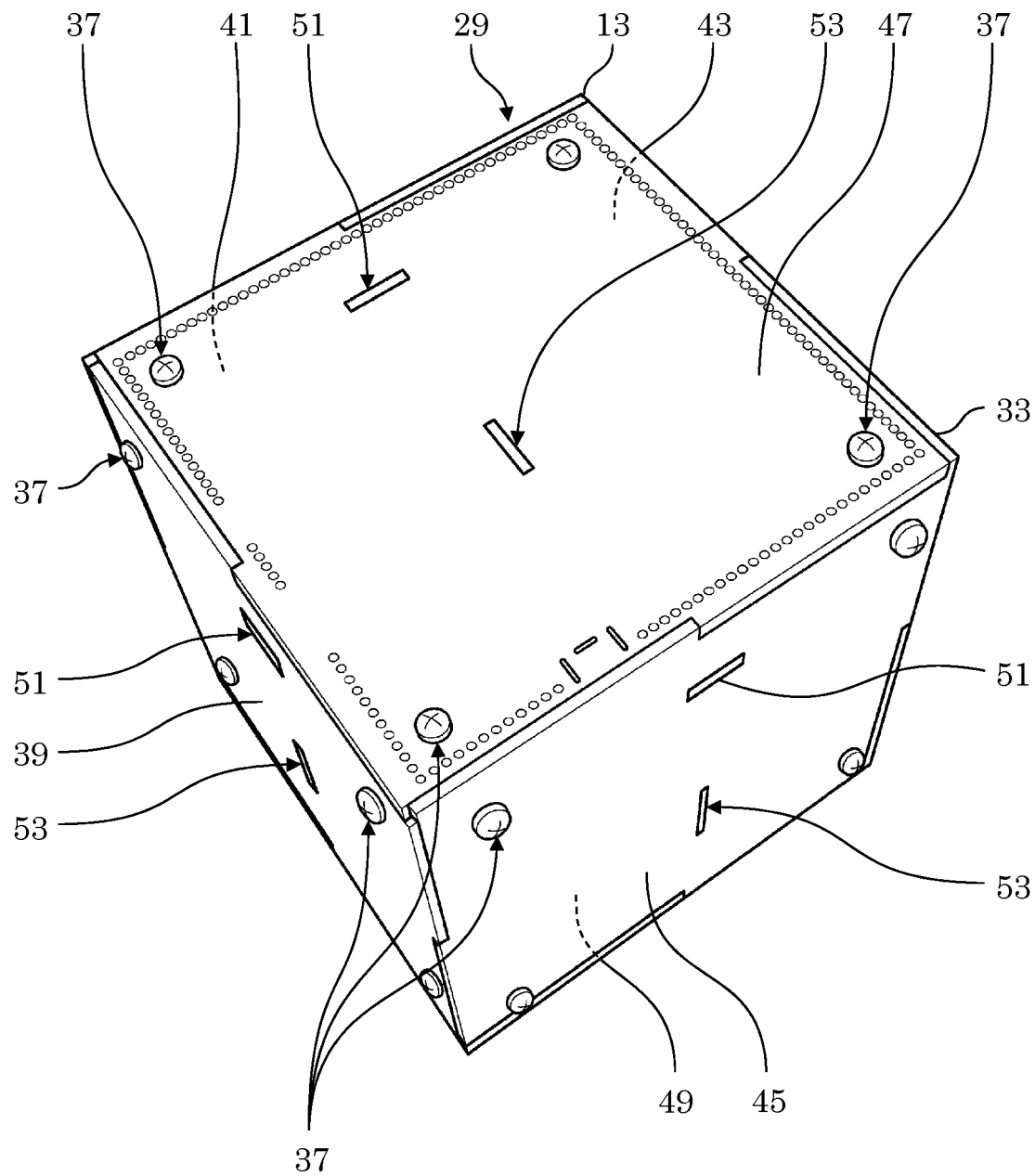
FIG. 10 is a perspective view of a polyhedral antenna formed as a regular hexahedron.

FIG. 10 is a perspective view of polyhedral antenna 29 formed as a regular hexahedron. Polyhedral antenna 29 has printed circuit board 33, which is an example of a surface material, and frame 35 (see FIG. 13), as main constituent elements. Printed circuit board 33 and frame 35 are fixed with fastening screws 37 to make up a housing. The housing is a hexahedron, and a case of the housing being a cube will be described exemplarily.

On polyhedral antenna 29, when its surface counter to the incoming direction of a measurement target radio wave is defined as first surface 39, surfaces adjacent to first surface 39 along the clockwise direction in a plan view can be defined as second surface 41, third surface 43, and fourth surface 45, while an upper surface and a lower surface can be defined respectively as fifth surface 47 and sixth surface 49. On polyhedral antenna 29, antennas, i.e., horizontal polarization antenna 51 and vertical polarization antenna 53, are placed on each of first surface 39 to sixth surface 49.

Figure 11:
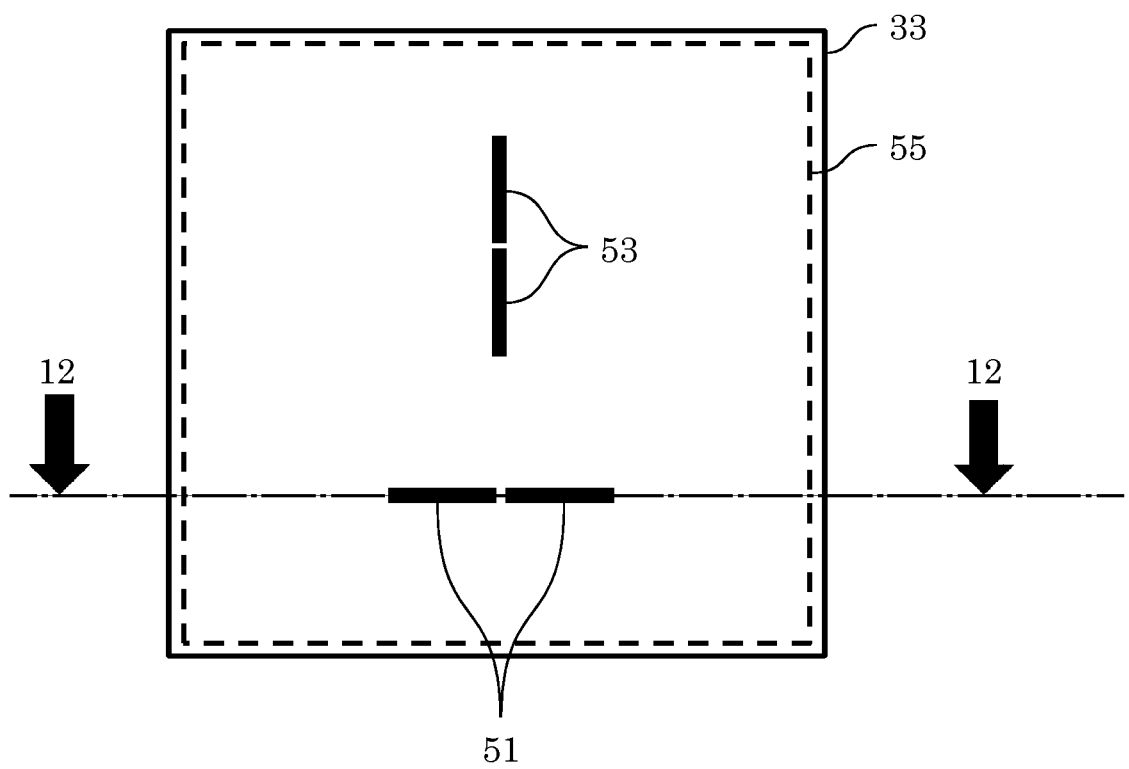
FIG. 11 is a front view of one surface of the polyhedral antenna.

FIG. 11 is a front view of one surface of polyhedral antenna 29. Polyhedral antenna 29 has one surface serving as a planar antenna. The planar antenna has horizontal polarization antenna 51 and vertical polarization antenna 53 that are placed on the surface of printed circuit board 33. Each of horizontal polarization antenna 51 and vertical polarization antenna 53 can be provided as a dipole antenna.

Figure 12:
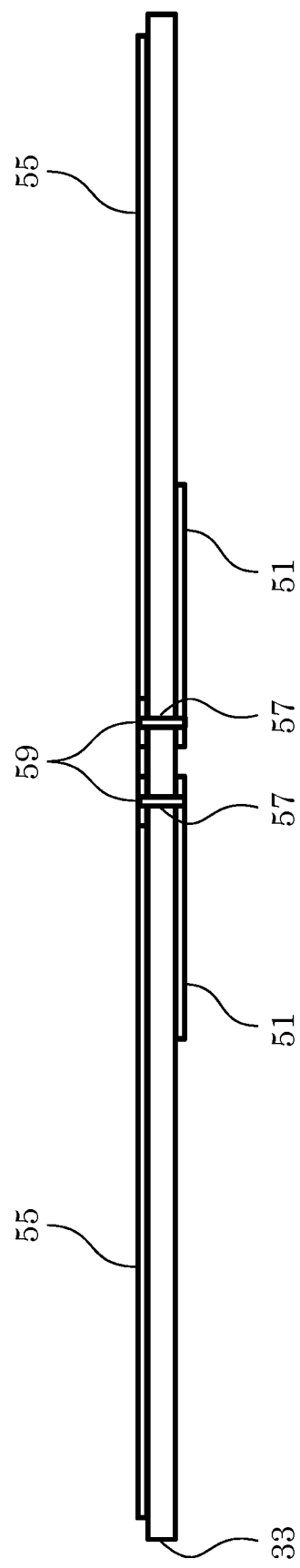
FIG. 12 is a cross-sectional view taken along line 12-12 in FIG. 11.

FIG. 12 is a cross-sectional view taken along line 12-12 in FIG. 11. The planar antenna is provided with shield layer 55 (separated from the dipole antennas by the thickness of printed circuit board 33) formed on the back surface of printed circuit board 33. To the dipole antennas, via conductors 57 are connected, which penetrate printed circuit board 33. On the back surface of printed circuit board 33, via conductors 57 serve as connection ends 59 isolated from shield layer 55.

Figure 13:
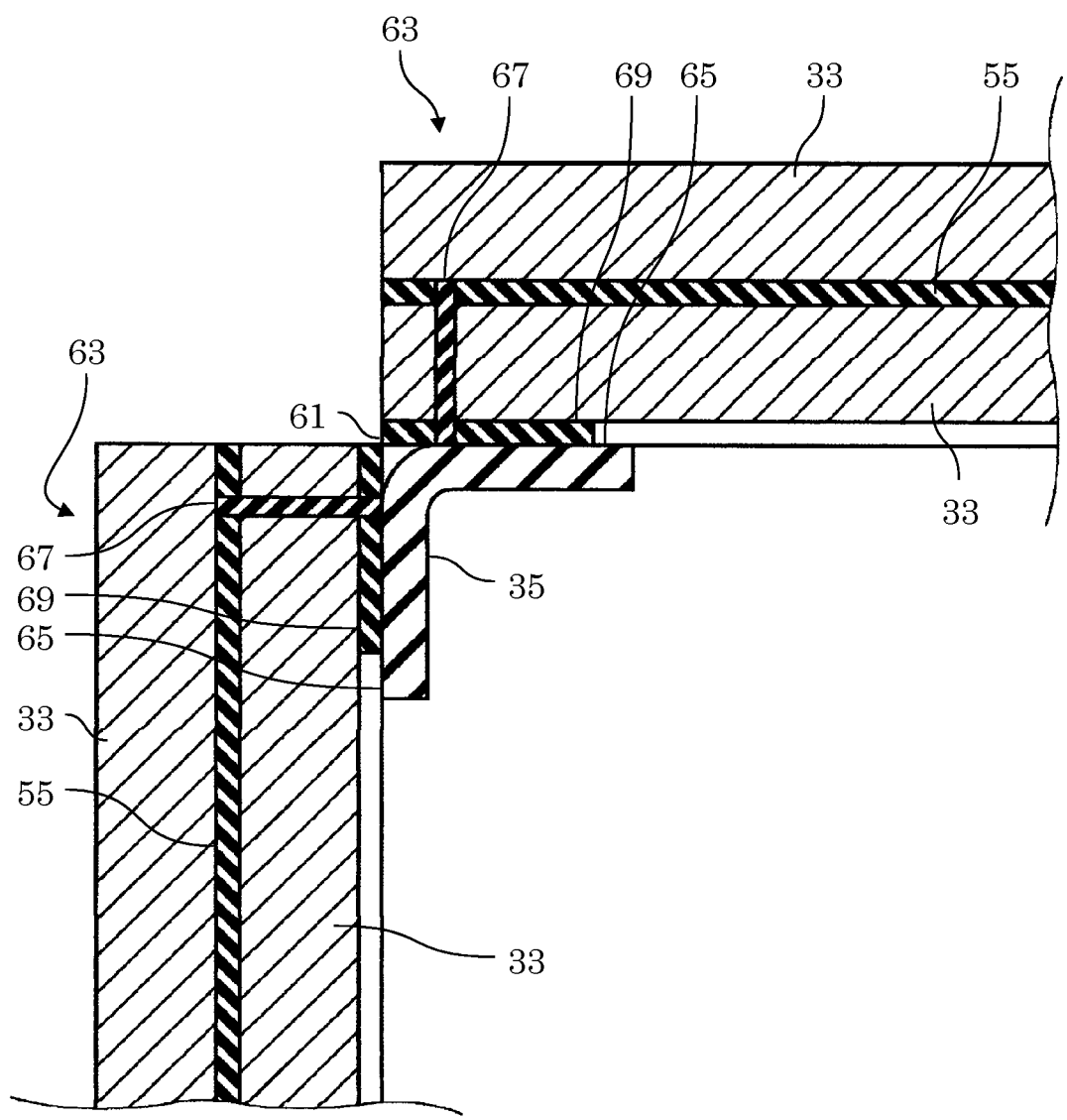
FIG. 13 is a schematic view conceptually showing a shield structure of a joint of the polyhedral antenna.

FIG. 13 is a diagrammatic view conceptually showing a shield structure of joint 61 of polyhedral antenna 29. Polyhedral antenna 29 may have laminated substrates 63 fixed to frame 35, laminated substrates 63 each having shield layer 55 as an intermediate layer. In this case, edges of laminated substrates 63 are fixed respectively to two crossover surfaces 65 of frame 35. Frame 35 has conductivity, fixes together the edges of laminated substrates 63, and electrically connects to shield layer 55 through grounding conductors 69 and grounding via conductors 67. In other words, adjacent printed circuit boards 33 fixed to two crossover surfaces 65 have grounding conductors 69 brought into contact respectively with two crossover surfaces 65, and are thus grounded at the same potential as the potential of frame 35.

As a result, a discontinuous part of grounding conductors 69, which is created by joint 61 where the edges join together, is made continuous by frame 35. This suppresses entry of radio waves into the cube. This polyhedral antenna 29, which suppresses entry of radio waves into the cube, is capable of more accurate measurement of the incoming direction of a radio wave than measurement of the same in a configuration that allows entry of radio waves.

Figure 14:
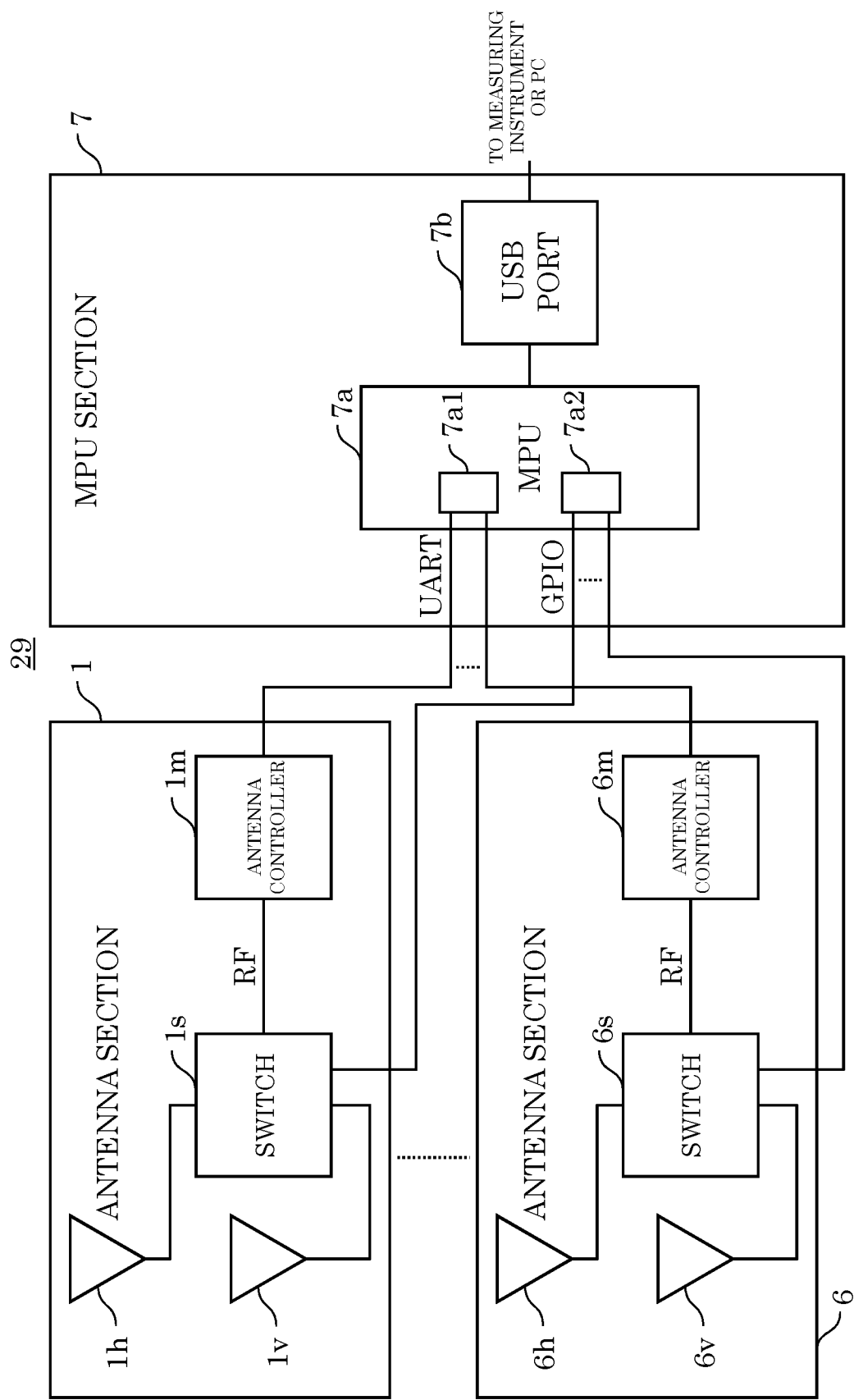
FIG. 14 is a block diagram showing an example of a hardware configuration of a reception system of the radio wave environment measurement device.

FIG. 14 is a block diagram showing an example of a hardware configuration of a reception system of radio wave environment measurement device 11. Polyhedral antenna 29 is configured to include antenna sections 1 to 6 and micro processing unit (MPU) section 7. Because antenna sections 1 to 6 are identical in configuration, to simplify the description, antenna section 1 will be described here as an example. In the following description of antenna section 1, a configuration of antenna section 1 may be read as a corresponding configuration of another antenna section.

Antenna section 1 includes horizontal polarization antenna 1h, vertical polarization antenna 1v, switch 1s, and antenna controller 1m.

Horizontal polarization antenna 1h receives a horizontally polarized wave component of a radio wave transmitted from radio transmitter 10TX (see FIG. 15) placed in an area. Specifically, it receives a horizontally polarized wave in a given frequency band (e.g., 5.0 GHz band). Horizontal polarization antenna 1h is electrically connected to switch 1s.

Vertical polarization antenna 1v receives a vertically polarized wave component of a radio wave transmitted from radio transmitter 10TX (see FIG. 15) placed in the area. Specifically, it receives a vertically polarized wave in a given frequency band (e.g., 5.0 GHz band). Vertical polarization antenna 1v is electrically connected to switch 1s.

Switch 1s connects horizontal polarization antenna 1h or vertical polarization antenna 1v to antenna controller 1m according to a switch changeover signal that is output from switch changeover controller 7a2 of MPU 7a in a time division manner for each of surfaces making up the housing of polyhedral antenna 29. In other words, switch 1s applies output from horizontal polarization antenna 1h or vertical polarization antenna 1v to antenna controller 1m, according to the above switch changeover signal.

Antenna controller 1m is configured using, for example, a circuit (module) for radio signals conforming to standard specifications for handling Wi-Sun (registered trademark) radio signals. Antenna controller 1m extracts output from horizontal polarization antenna 1h or vertical polarization antenna 1v connected to switch 1s, as parallel format data (e.g., reception field intensity of a radio wave transmitted from radio transmitter 10TX), and outputs the parallel format data to data converter 7a1 of MPU 7a.

MPU section 7 includes micro processing unit (MPU) 7a and universal serial bus (USB) port 7b.

MPU 7a functions as a controller of polyhedral antenna 29, and performs control processing for comprehensively controlling operations of respective component units of polyhedral antenna 29, data input/output processing for handling input/output data from/to each component unit of polyhedral antenna 29, data calculation processing, and data storage processing. MPU 7a includes data converter 7a1 and switch changeover controller 7a2.

Data converter 7a1 is configured using, for example, a universal asynchronous receiver/transmitter (UART) circuit, and converts parallel format data output from each antenna controller (e.g., each of antenna controllers 1m to 6m), into serial format data. This data (e.g., reception field intensity of a radio wave transmitted from radio transmitter 10TX) is input to a measuring instrument (e.g., a spectrum analyzer or network analyzer) connected to polyhedral antenna 29, via USB port 7b. In the first exemplary embodiment, measuring instruments may include a personal computer (PC).

Switch changeover controller 7a2 generates a switch changeover signal in a time division manner, the switch changeover signal being a signal for applying output from the horizontal polarization antenna or the vertical polarization antenna of any one of the surfaces of polyhedral antenna 29 to MPU section 7. Switch changeover controller 7a2 has a general-purpose input/output (GPIO) terminal, and outputs the above switch changeover signal generated in the time division manner to the switch on each surface (e.g., switches 1s to 6s), via the GPIO terminal. Hence, thanks to the switch changeover signal, only the output value from one of the antennas can be exclusively input to MPU 7a periodically at every given time, in the input order of output from horizontal polarization antenna 1h of antenna section 1, output from vertical polarization antenna 1v of antenna section 1, . . . , output from horizontal polarization antenna 6h of antenna section 6, and output from vertical polarization antenna 6v of antenna section 6.

It should be noted that switch changeover controller 7a2 may generate a control signal for applying outputs from respective horizontal polarization antennas and vertical polarization antennas of all surfaces of polyhedral antenna 29 simultaneously to the MPU section 7. Switch changeover controller 7a2 outputs the above-described control signal simultaneously to respective switches (e.g., switches 1s to 6s) of the surfaces, via the GPIO terminal. Hence, thanks to the control signal, output from horizontal polarization antenna 1h of antenna section 1, output from vertical polarization antenna 1v of antenna section 1, . . . , output from horizontal polarization antenna 6h of antenna section 6, and output from vertical polarization antenna 6v of antenna section 6 can be input simultaneously to MPU 7a. On all surfaces of polyhedral antenna 29, therefore, measurements by both horizontal polarization antenna and vertical polarization antenna can be made simultaneously.

USB port 7b connects polyhedral antenna 29 to a PC or measuring instrument (e.g., a spectrum analyzer or network analyzer), which is not illustrated.

It should be noted that although the case of polyhedral antenna 29 receiving a radio wave is descried above, polyhedral antenna 29 may be considered to be an antenna that has a configuration for radio wave transmission. Specifically, polyhedral antenna 29 may make time division switching to any one of antenna sections 1 to 6 to be used and may transmit radio waves in a time division manner from the horizontal polarization antenna or the vertical polarization antenna provided in the antenna section to be used. Radio transmitter 10TX to be described later, therefore, can have the same configuration as polyhedral antenna 29.

The PC (not illustrated) is connected to polyhedral antenna 29 via a USB cable (not illustrated), polyhedral antenna 29 receiving a radio wave transmitted from radio transmitter 10TX (see FIG. 15) in the area. Based on detected output (e.g., reception field intensity) of the radio wave received by polyhedral antenna 29, the PC measures and calculates radio wave reception power at a point in the area. The PC can measure the radio wave intensities of a horizontally polarized wave and a vertically polarized wave at each frequency, based on detected outputs at the horizontal polarization antenna and vertical polarization antenna arranged on respective surfaces of polyhedral antenna 29. In addition, the PC can identify the incoming direction of a reflected wave, based on detected outputs at the horizontal polarization antenna and vertical polarization antenna arranged on respective surfaces of polyhedral antenna 29, and determine whether an obstacle (scatterer), such as a wall surface, absorbs the radio wave. The PC may be housed in airframe 15 or may be provided as a separate PC independent of frame 15. In a case where the PC is provided as a separate PC independent of airframe 15, each measured value is stored in the storage device and then is read by the PC through its wired connection or the like to airframe 15.

Figure 15:
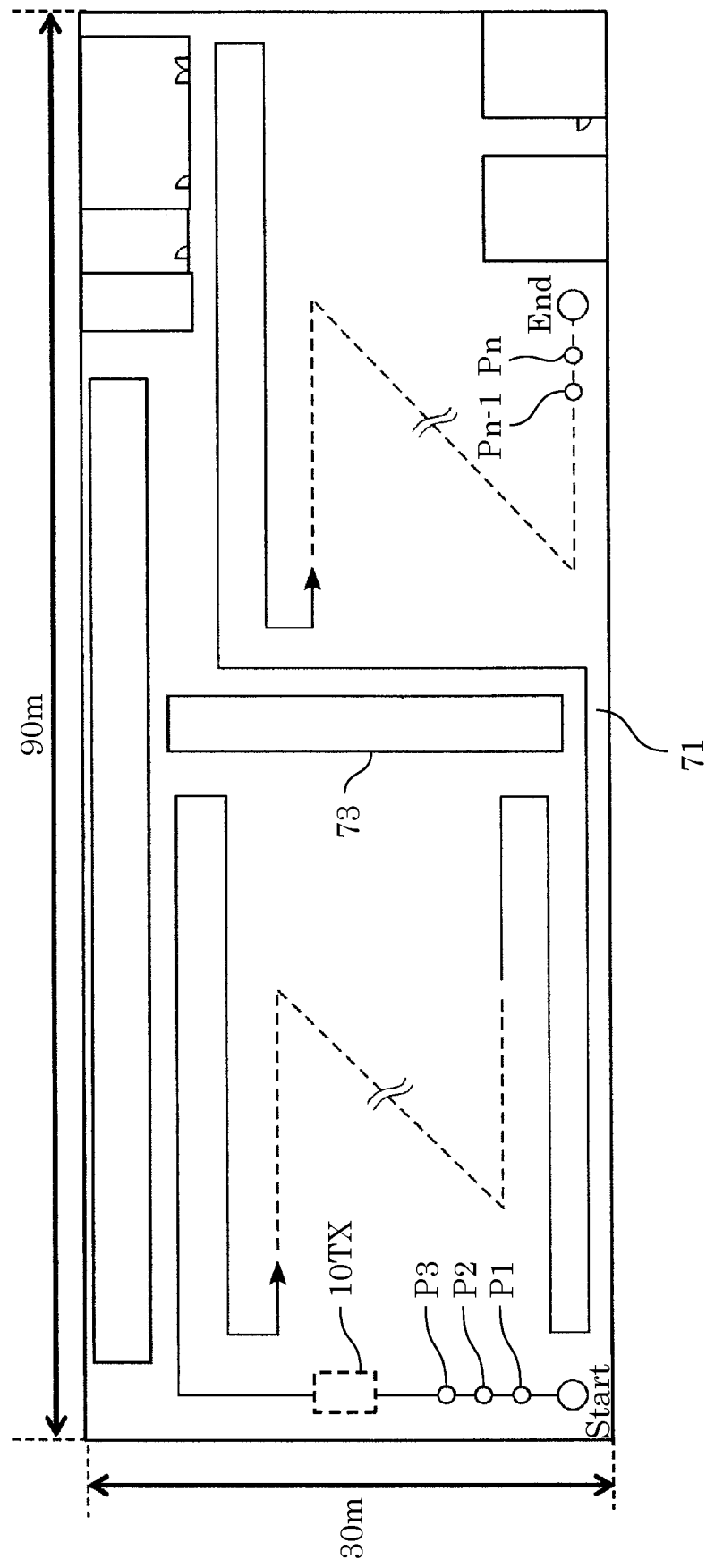
FIG. 15 depicts an example of a target area in which the radio wave environment measurement device makes measurement.

FIG. 15 depicts an example of target area 71 in which radio wave environment measurement device 11 makes measurement. Target area 71 is, for example, a factory with a vast area of 30 meters deep and 90 meters wide, and radio transmitter 10TX is disposed at an elevated location (e.g., 180 cm high above the floor surface) on one end side. At an approximate center of target area 71, wall 73, which is an example of a scatterer, is placed. Drone 17 can be flied in target area 71 by manual remote control.

In addition, drone 17 can acquire its current position, using, for example, a global navigation satellite system (GNSS), which is a satellite positioning system. In this case, drone 17 stores map information, current location information, measurement coordinates points, and detection values of target area 71 in the storage device.

In radio wave environment measurement, for example, waypoints making up a flight route may be created in advance by desk work before the flight of drone 17. The waypoints are set in the order of passage on a line representing a flight route written with one stroke. The waypoints are stored in the storage device of drone 17, together with direction information at each waypoint.

In this case, drone 17 is able to keep flying while referring to map information of target area 71 and waypoints P1, P2, P3 to Pn−1, Pn and automatically make measurement at each measurement coordinates point. Drone 17 stores a measured value at each measurement coordinates point, together with location information, in the storage device. The flight controller determines whether drone 17 have passed all waypoints P1 to Pn. When drone 17 have passed all waypoints P1 to Pn, the flight controller ends the measurement.

(Operations of Radio Wave Environment Measurement Device)

Operations of radio wave environment measurement device 11 according to the first exemplary embodiment will then be described.

Radio wave environment measurement device 11 according to the first exemplary embodiment includes drone 17 capable of moving in midair, polyhedron 13 attached to airframe 15 of drone 17, polyhedron 13 having a plurality of surfaces, and an antenna provided on each of the plurality of surfaces of polyhedron 13.

In radio wave environment measurement device 11 according to the first exemplary embodiment, polyhedron 13 is attached to airframe 15 of drone 17. The plurality of surfaces of polyhedron 13 are each provided with an antenna serving as a reception antenna. Polyhedron 13 can be referred to as polyhedral antenna 29 having antennas on its plurality of surfaces. Radio wave environment measurement device 11 including polyhedral antenna 29 is allowed to fly in target area 71, of which a radio wave environment is measured by drone 17 flying and moving in target area 71. In this target area 71, at least transmission antenna 75 of radio transmitter 10TX, which serves as a signal source, is disposed. In drone 17, each of reception antennas provided on polyhedral antenna 29 receives a radio wave transmitted from transmission antenna 75. The received radio wave is analyzed and processed by the PC integrated into or separated from radio wave environment measurement device 11. Through the analysis process by the PC, a reception intensity of drone 17 at each measurement point is obtained. The reception intensity may be considered to be, for example, reception power or reception field intensity. In target area 71, drone 17 is caused to move to a desired location and store a reception intensity at each measurement point. This allows drone 17 to obtain a radio wave environment.

According to a conventional radiant power measurement system described in Patent Literature 1 and the like, in contrast, when drone 17 moves to a given location separated away from transmission antenna 75 by a given distance, drone 17 needs to make a rotation motion so that the incoming direction of a radio wave corresponds to the direction of the reception antenna.

Radio wave environment measurement device 11, on the other hand, has the reception antennas provided on the plurality of surfaces of polyhedron 13. This means that directionality is reduced. As a result, when drone 17 is in non-rotation state, the reception antennas can simultaneously detect reception field intensities in a plurality of directions. Among these reception antennas, a reception antenna set in a direction closest to the incoming direction of a radio wave from transmission antenna 75 provides a maximum reception field intensity. Radio wave environment measurement device 11, therefore, can detect the maximum reception field intensity at each measurement point in target area 71, without rotating drone 17.

As described above, in radio wave environment measurement device 11, searching a direction in which sensitivity is the maximum does not require the rotation motion of drone 17 at each measurement point. As a result, a measurement time can be reduced significantly by a total time spent on the rotation motion. According to radio wave environment measurement device 11 of the present exemplary embodiment, therefore, the time for measuring radio wave intensities using drone 17 can be reduced to be shorter than the time for measuring radio wave intensities in a conventional system.

In radio wave environment measurement device 11, polyhedron 13 is attached to airframe 15 across a gap formed therebetween, the gap being equivalent to 1 wavelength or larger in a working frequency band corresponding to the antenna.

In this radio wave environment measurement device 11, drone 17 has airframe 15. In drone 17, in general, airframe 15 houses a receiver, a transmitter, a flight controller, a gyro sensor, an acceleration sensor, a satellite positioning system, a battery, and the like. The outer shell of airframe 15 is usually made of a light synthetic resin. To airframe 15, the plurality of rotary drivers 23, each of which has the rotor blade (rotor 19) fixed to drive shaft 21 of the motor, are fixed in radial directions, with arm members 25 interposed respectively between airframe 15 and rotary drivers 23. There is therefore a possibility that airframe 15 may scatter a measurement target radio wave because of various pieces of electrical equipment housed in airframe 15. To prevent such a case, polyhedral antenna 29 is attached to airframe 15 across the gap formed therebetween, the gap being equivalent to 1 wavelength or larger. This allows radio wave environment measurement device 11 to suppress influences that the measurement target radio wave scattered by airframe 15 exerts on the reception performance of polyhedral antenna 29. As a result, radio wave environment measurement device 11 is able to reduce an error in measurement of the measurement target radio wave.

When polyhedral antenna 29 has an antenna surface (a surface of polyhedron 13 that is provided with an antenna) counter to airframe 15, a measurement error on the antenna surface counter to the airframe, i.e., counter-to-airframe antenna surface increases due to multiple reflection or the like. This increasing measurement error affects an overall error that occurs at the polyhedral antenna as a whole. In this case, polyhedral antenna 29 is attached to airframe 15 across a gap equivalent to 1.5 wavelengths or larger. This suppresses multiple reflection on the counter-to-airframe antenna surface. It is therefore further preferable that polyhedral antenna 29 be attached to airframe 15 across a gap equivalent to 1.5 wavelengths or larger. In other words, if an arrangement structure including no counter-to-airframe antenna surface is adopted, polyhedral antenna 29 can be attached to airframe 15 across a gap equivalent to 1 wavelength or larger.

In radio wave environment measurement device 11, polyhedron 13 is attached above airframe 15 in the vertical direction.

In this radio wave environment measurement device 11, polyhedral antenna 29 is attached above airframe 15 in the vertical direction. In this case, radio wave environment measurement device 11 is preferably used in a measurement target space where a measurement target radio wave comes from above polyhedral antenna 29. In this application, polyhedral antenna 29 is allowed to linearly receive a radio wave coming in from transmission antenna 75 without being blocked by airframe 15, thus being able to reduce an error in measurement of a measurement target radio wave. Such measurement target spaces include, for example, a stadium, a concert hall, a factory, and a warehouse, where transmission antenna 75, which outputs a measurement target radio wave, is set in a high place.

In radio wave environment measurement devices 11A, 11C, polyhedron 13 is attached below airframe 15 in the vertical direction.

In radio wave environment measurement devices 11A, 11C, polyhedral antenna 29 is attached below airframe 15 in the vertical direction. In this case, radio wave environment measurement devices 11A, 11C is preferably used in a measurement target space where a measurement target radio wave comes from below polyhedral antenna 29. In this application, polyhedral antenna 29 is allowed to linearly receive a radio wave coming in from transmission antenna 75 without being blocked by airframe 15, thus being able to reduce an error in measurement of a measurement target radio wave.

Further, in radio wave environment measurement device 11, polyhedron 13 is attached to airframe 15 with supports 31 interposed therebetween, supports 31 at least having their surfaces covered with a resin material.

This radio wave environment measurement device 11 prevents, for example, a case where a measurement target radio wave is reflected on supports 31 made of metal and is detected by polyhedral antenna 29, or a case where a measurement target radio wave reflected by airframe 15 is further reflected by supports 31 made of metal and is detected by polyhedral antenna 29. In this manner, supports 31 having their surfaces covered with the resin material can reduce erroneous detections, thus reducing an error in measurement of a measurement target radio wave.

In radio wave environment measurement device 11, polyhedron 13 is a regular polyhedron, and is attached to airframe 15 such that the center of the regular polyhedron is put on a vertical line passing through the center of the airframe.

In this radio wave environment measurement device 11, polyhedron 13 is formed as a regular polyhedron. The regular polyhedron is attached to airframe 15 such that the center of the regular polyhedron is put on the vertical line passing through the center of the airframe. Drone 17 is classified into one of these types: tricopter with three rotary drivers 23 each having rotor 19, quadcopter with four rotary drivers 23, hexacopter with six rotary drivers 23, and octocopter with eight rotary drivers 23. Drones 17 of these types are controlled in their ascending and descending movements by the number of rotations of rotors 19. In addition, the forward movement, backward movement, turning, and the like of drone 17 are controlled by changing the number of rotations of each rotor 19 and tilting airframe 15. The number of rotations of each motor is controlled in such a way that a tilt of airframe 15 is detected by the gyro sensor housed and the number of rotations of the motor is changed for positional shifting in a direction of correcting the tilt.

The center of the airframe can be defined as a central point of which distances to respective drive shafts 21 of rotary drivers 23 are the same. When radio wave environment measurement device 11 takes a position in which each drive shaft 21 is set in the vertical direction, the center of the polyhedron is put on a vertical line passing through the center of the airframe. As described above, the center of the polyhedron may be considered to be the center of gravity. It is preferable that at each measurement point, radio wave environment measurement device 11 hover in midair. By putting the center of the polyhedron on the vertical line passing through the center of the airframe, radio wave environment measurement device 11 facilitates control of rotation of each motor at the time of hovering in midair, thus easily stabilizing flight performance.

In radio wave environment measurement device 11, polyhedron 13 has a hexahedral shape.

In this radio wave environment measurement device 11, polyhedron 13 is formed as a hexahedron. Polyhedron 13 formed as a hexahedron is attached to airframe 15 in a direction in which four side surfaces are set in the vertical direction. This arrangement allows simplification of calculations for detecting horizontally polarized radio waves and vertically polarized radio waves. In this case, polyhedron 13 formed as a regular hexahedron further simplifies the calculations. In a case of polyhedron 13 being a regular polyhedron, it is possible to assemble polyhedron 13 using antenna surface materials of the same configuration for individual surfaces. In other words, the assembling can be performed using six antenna surface materials as common members. Polyhedral antenna 29, therefore, can be fabricated easily at low cost.

In radio wave environment measurement devices 11B, 11C, polyhedron 13 has an apex, and is attached with its apex set counter to airframe 15.

In radio wave environment measurement devices 11B, 11C, the apex of polyhedral antenna 29 is counter to airframe 15. Because polyhedral antenna 29 no longer has an antenna surface parallel with airframe 15, multiple reflection is less likely to occur between airframe 15 and an antenna surface. Radio wave environment measurement devices 11B, 11C are thus able to suppress the influence of multiple reflection and reduce an error in measurement of a measurement target radio wave.

In radio wave environment measurement device 11D, polyhedron 13D has a truncated pyramid shape.

In this radio wave environment measurement device 11D, polyhedron 13D is a truncated pyramid. Polyhedral antenna 29D of a truncated pyramidal is attached to airframe 15 in a direction in which a bottom area is larger than an upper area. In this case, no antenna is provided on a bottom surface serving as a counter-to-airframe antenna surface, where multiple reflection tends to occur. Thus, in radio wave environment measurement device 11D having the truncated pyramid, the counter-to-airframe surface with a large bottom area carrying no antenna is attached to airframe 15. As a result, radio wave environment measurement device 11D can suppress air resistance at a position separated away from the center of the airframe during horizontal flight. Further, in radio wave environment measurement device 11D, polyhedral antenna 29D is formed as a truncated pyramid, and this allows polyhedral antenna 29D to be fixed to airframe 15 with high strength.

(Example of Actual Measurement of Radio Wave Environment)

Radio wave environment measurement device 11 according to the first exemplary embodiment is manufactured experimentally and a degree of variations in radio wave intensities of horizontally polarized radio waves and vertically polarized radio waves is examined and examination results will be described next.

Figure 16:
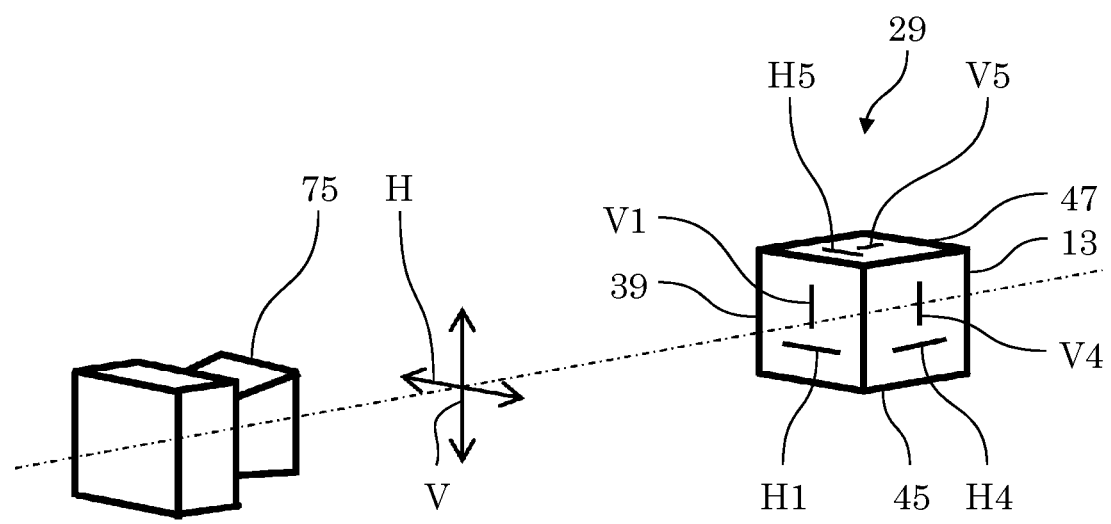
FIG. 16 is an explanatory diagram showing a concept of measurement made by the polyhedral antenna.

FIG. 16 is an explanatory diagram showing a concept of measurement made by polyhedral antenna 29. As shown in FIGS. 11 and 12, the planar antenna includes printed circuit board 33, which is a multilayer laminated board. Printed circuit board 33 carries the dipole antennas on its front surface and shield layer 55 on its back surface. On the planar antenna, horizontal polarization antenna 51 and vertical polarization antenna 53 are arranged on the same plane. The frequency of a measurement target radio wave is determined to be 5.0 GHz. The planar antenna is formed as a square, and 6 surfaces are assembled to create a regular hexahedron, which is polyhedral antenna 29 (regular hexahedron antenna).

As shown in FIG. 10, polyhedral antenna 29 has a surface counter to the incoming direction of a measurement target radio wave having horizontal polarization direction H and vertical polarization direction V, the measurement target radio wave being emitted from transmission antenna 75, and this surface is defined as first surface 39. On polyhedral antenna 29, the surfaces adjacent to first surface 39 along the clockwise direction in a plan view are defined as second surface 41, third surface 43, and fourth surface 45. The upper surface and the lower surface are defined respectively as fifth surface 47 and sixth surface 49.

Horizontal polarization antennas 51 provided on first surface 39 to sixth surface 49 are defined respectively as H1 antenna to H6 antenna (corresponding to horizontal polarization antennas 1h to 6h). Vertical polarization antennas 53 provided on first surface 39 to sixth surface 49 are defined respectively as V1 antenna to V6 antenna (corresponding to vertical polarization antennas 1v to 6v).

FIG. 17 is a schematic explanatory diagram of a measurement method carried out by using radio wave environment measurement device 11 according to the exemplary embodiment. A radio wave with a measurement target frequency (e.g., 5.0 GHz) is emitted from transmission antenna 75, and measurement is made in both cases: a case where polyhedral antenna 29 provided separately makes measurements of the radio wave and a case where polyhedral antenna 29 incorporated in drone 17 makes measurements of the radio wave. Polyhedral antenna 29 provided in drone 17 makes measurements at a plurality of different intervals (a/λ).

FIG. 18 is an explanatory diagram showing a degree of variations in a vertically polarized radio wave intensity actually measured by the method of FIG. 17. In FIG. 18, the vertical axis represents a radio wave intensity ratio between a case of drone 17 being present and a case of drone 17 being absent (drone being present/drone being absent), the ratio being expressed in terms of dB. The horizontal axis represents a ratio between gap a and wavelength λ (gap a/λ). Each measured value is indicated by the plotted position of each of pictorial symbols representing V1 antenna to V6 antenna shown in FIG. 18.

FIG. 19 is an explanatory diagram showing a degree of variations in a horizontally polarized radio wave intensity actually measured by the method of FIG. 17. In FIG. 19, the vertical axis and the horizontal axis use the same scale as used by the vertical axis and the horizontal axis of FIG. 18. Each measured value is indicated by the plotted position of each of pictorial symbols representing H1 antenna to H6 antenna shown in FIG. 19.

Measurement results shown in FIGS. 18 and 19 demonstrate a finding that setting gap a to 1 wavelength λ keeps the degree of variations within a range of ±3 dB. In particular, it is found that the degree of variations in the vertically polarized radio wave intensity and the degree of variations in the horizontally polarized radio wave intensity are large at H6 antenna and V6 antenna that are counter to airframe 15. It is also found that the degree of variations at H6 antenna and V6 antenna can be reduced by setting gap a 1.5 times or larger of 1 wavelength λ. The above results has led to a conclusion that gap a should preferably be 1 wavelength λ or larger, and should further preferably be within a range K of 1.5 times or larger of 1 wavelength λ.

Various exemplary embodiments have been described above with reference to drawings. The present disclosure, needless to say, is not limited to these exemplary embodiments. Obviously, those who are skilled in the art can conceive various changes, modifications, substitutions, additions, deletions, and equivalents within the scope of what is described in the claims, and it is understood that they too rightfully belong to the technical scope of the present disclosure. In addition, constituent elements in various exemplary embodiments described above may be combined arbitrarily, providing that such combinations do not deviate from the substance of the invention.

In the first exemplary embodiment described above, it has been stated that measuring instruments are connected to polyhedral antenna 29. A spectrum analyzer or the like (e.g., measuring instrument or PC shown in FIG. 14), however, may be incorporated in, for example, polyhedral antenna 29. Polyhedral antenna 29 has the shield structure shown in FIG. 13. Because of this, when the measuring instruments are incorporated in polyhedral antenna 29, noise that affects the electromagnetic compatibility (EMC) of the spectrum analyzer or the like is cut off by the shield structure, which alleviates influences on radio wave measurement.

The present disclosure can improve the accuracy of measurement of a radio wave environment, the measurement being made in a measurement target area where a moving body is present in an actual environment, and suppress an increase in measurement time, and is therefore useful as radio wave environment measurement in which radio wave measurement is executed efficiently.

What is claimed is:

1. A radio wave environment measurement device comprising:
   a multi-copter type unmanned flight vehicle configured to move in midair;
   a polyhedron attached to an airframe of the multi-copter type unmanned flight vehicle, the polyhedron having a plurality of surfaces; and
   an antenna provided on each of the plurality of surfaces of the polyhedron,
   wherein the polyhedron is attached to the airframe across a gap between the polyhedron and the airframe, the gap being equivalent to 1 wavelength or larger in a working frequency band corresponding to the antenna.

2. The radio wave environment measurement device according to claim 1, wherein the polyhedron is stationarily attached above the airframe in a vertical direction.

3. The radio wave environment measurement device according to claim 1, wherein the polyhedron is stationarily attached below the airframe in a vertical direction.

4. The radio wave environment measurement device according to claim 1, wherein the polyhedron is attached to the airframe with a support interposed between the polyhedron and the airframe, the support at least having a surface covered with a resin material.

5. The radio wave environment measurement device according to claim 1, wherein the polyhedron has a shape of a regular polyhedron, and is attached to the airframe, with a center of the regular polyhedron disposed on a vertical line passing through a center of the airframe of the multi-copter type unmanned flight vehicle.

6. The radio wave environment measurement device according to claim 1, wherein the polyhedron has a hexahedral shape.

7. The radio wave environment measurement device according to claim 1, wherein the polyhedron has an apex, and is attached with the apex set counter to the airframe.

8. The radio wave environment measurement device according to claim 1, wherein the polyhedron has a truncated pyramid shape.

* * * * *